United States Patent
Liu et al.

(10) Patent No.: US 8,138,797 B1
(45) Date of Patent: Mar. 20, 2012

(54) INTEGRATED CIRCUITS WITH ASYMMETRIC PASS TRANSISTORS

(75) Inventors: Jun Liu, Milpitas, CA (US); Albert Ratnakumar, San Jose, CA (US); Mark T. Chan, San Jose, CA (US); Irfan Rahim, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/790,660

(22) Filed: May 28, 2010

(51) Int. Cl.
*H01L 25/00* (2006.01)
*H03K 19/00* (2006.01)
(52) U.S. Cl. .............. 326/102; 326/37; 326/41; 326/47
(58) Field of Classification Search .................... None
See application file for complete search history.

(56) References Cited

U.S. PATENT DOCUMENTS

| | | | |
|---|---|---|---|
| 4,894,801 A | 1/1990 | Saito et al. | |
| 5,363,328 A | 11/1994 | Browning, III et al. | |
| 5,576,238 A | 11/1996 | Fu | |
| 5,753,958 A * | 5/1998 | Burr et al. ................. | 257/392 |
| 6,033,957 A | 3/2000 | Burns, Jr. et al. | |
| 6,110,783 A | 8/2000 | Burr | |
| 6,278,290 B1 * | 8/2001 | Young ........................ | 326/41 |
| 6,501,295 B1 * | 12/2002 | Burr ........................... | 326/38 |
| 6,620,679 B1 | 9/2003 | Tzeng et al. | |

OTHER PUBLICATIONS

Xiang et al., U.S. Appl. No. 12/069,271, filed Feb. 8, 2008.
Xiang et al., U.S. Appl. No. 60/964,917, filed Aug. 16, 2007.
Kim et al., "Relaxing Conflict Between Read Stability and Writability in 6T SRAM Cell Using Asymmetric Transistors", IEEE Electron Device Letters, vol. 30, No. 8, Aug. 2009.
Zhou et al. "A Novel Hetero-Material Gate (HMG) MOSFET for Deep-Submicron ULSI Technology", IEEE Transactions on Electron Devices, vol. 45, No. 12, Dec. 1998.
Ratnakumar et al., U.S. Appl. No. 12/324,789, filed Nov. 26, 2008.
Liu et al., U.S. Appl. No. 12/324,791, filed Nov. 26, 2008.
Liu et al., U.S. Appl. No. 12/629,831, filed Dec. 2, 2009.
Rahim et al., U.S. Appl. No. 12/568,638, filed Sep. 28, 2009.
Lee et al., U.S. Appl. No. 12/391,230, filed Feb. 23, 2009.

* cited by examiner

*Primary Examiner* — Anh Tran
(74) *Attorney, Agent, or Firm* — Treyz Law Group; G. Victor Treyz; Chih-Yun Wu

(57) ABSTRACT

Asymmetric transistors such as asymmetric pass transistors may be formed on an integrated circuit. The asymmetric transistors may have gate structures. Symmetric pocket implants may be formed in source-drains on opposing sides of each transistor gate structure. Selective heating may be used to asymmetrically diffuse the implants. Selective heating may be implemented by patterning the gate structures on a semiconductor substrate so that the spacing between adjacent gate structures varies. A given gate structure may be located between first and second adjacent gate structures spaced at different respective distances from the given gate structure. A larger gate structure spacing leads to a greater substrate temperature rise than a smaller gate structure spacing. The pocket implant diffuses more in portions of the substrate with the greater temperature rise, producing asymmetric transistors. Asymmetric pass transistors may be controlled by static control signals from memory elements to implement circuits such as programmable multiplexers.

16 Claims, 13 Drawing Sheets

INTEGRATED CIRCUITS WITH ASYMMETRIC PASS TRANSISTORS

BACKGROUND

This invention relates to integrated circuits, and more particularly, to circuits with asymmetric transistors such as programmable integrated circuits with asymmetric pass transistors and to methods for forming asymmetric transistors.

Logic circuits such as programmable logic circuits are typically constructed from metal-oxide-semiconductor (MOS) transistors. In many logic circuit applications, MOS transistors are used to selectively pass or block passage of logic signals in response to a control signal from a memory element or other source. When used in this way, an MOS transistor is typically referred to as a pass transistor or pass gate.

Conventional logic circuits use n-channel metal-oxide-semiconductor (NMOS) and p-channel metal-oxide-semiconductor (PMOS) transistors. Pass gates are typically formed from NMOS transistors.

Although satisfactory in a variety of applications, NMOS pass gates have difficulty is passing logic ones. As the voltage at the input of a pass gate rises, the gate-to-source voltage Vgs falls and its threshold voltage Vt rises, making the pass gate weaker. Because of this behavior, the rising edges of logic pulses that pass through conventional NMOS pass gates tend to be broadened more than trailing edges. Pass gate performance can be improved somewhat by using an elevated control signal to overdrive the gate of the pass gate, but only at the expense of increased leakage current and a corresponding rise in power consumption. Pass gate performance can also be improved somewhat by using both n-channel and p-channel devices in each pass gate (i.e., forming so-called CMOS pass gates), but only at the expense of increased pass gate area.

It would therefore be desirable to be able to provide improved pass transistors, methods of forming such improved transistors, and integrated circuits such as programmable integrated circuits with improved transistors.

SUMMARY

Asymmetric transistors such as asymmetric pass transistors may be formed on an integrated circuit. The asymmetric transistors may be n-channel metal-oxide-semiconductor transistors that have energy barriers at one of their source-drain terminals. The presence of an energy barrier at the input of a pass transistor helps the transistor pass logic ones. By equalizing logic signal rise and fall times, overall pass gate performance may be enhanced for a given leakage current.

The asymmetric transistors may have gate structures. Symmetric pocket implants may be formed in source-drains on opposing sides of each transistor gate structure. Selective heating may be used to asymmetrically diffuse the implants. Selective heating may be implemented by patterning the gate structures on a semiconductor substrate so that the spacing between adjacent gate structures varies. Each gate structure may span a stripe-shaped source-drain doping region at a different location. The stripe-shaped source-drain doping region and the asymmetric pass gates associated with the stripe-shaped source-drain doping region may be located between respective groups of memory elements. For example, first and second memory elements may be used in controlling a set of interposed asymmetric pass gates.

The different gate structure spacings that are used may help create transistor asymmetry during fabrication. A given gate structure may be located between first and second adjacent gate structures spaced at different respective distances from the given gate structure. Under application of heat from an infrared lamp, a larger gate structure spacing leads to a greater substrate temperature rise than a smaller gate structure spacing. The pocket implant dopant diffuses substantially in the portion of the substrate with the greater temperature rise. As a result, the pocket implant in the source-drain region on one side of the gate structure (i.e., the side with a narrower gate-structure-to-gate-structure spacing) does not diffuse significantly. The pocket implant in the source-drain region on the other side of the gate structure (i.e., the side with a wider gate-structure-to-gate-structure spacing) diffuses significantly. Asymmetric diffusion techniques such as this result in asymmetric transistors (i.e., transistors with energy barriers at one of their source-drain terminals).

Asymmetric pass transistors may be controlled by static control signals from memory elements to implement circuits such as programmable multiplexers.

Further features of the invention, its nature and various advantages will be more apparent from the accompanying drawings and the following detailed description of the preferred embodiments.

DETAILED DESCRIPTION

Figure 1:
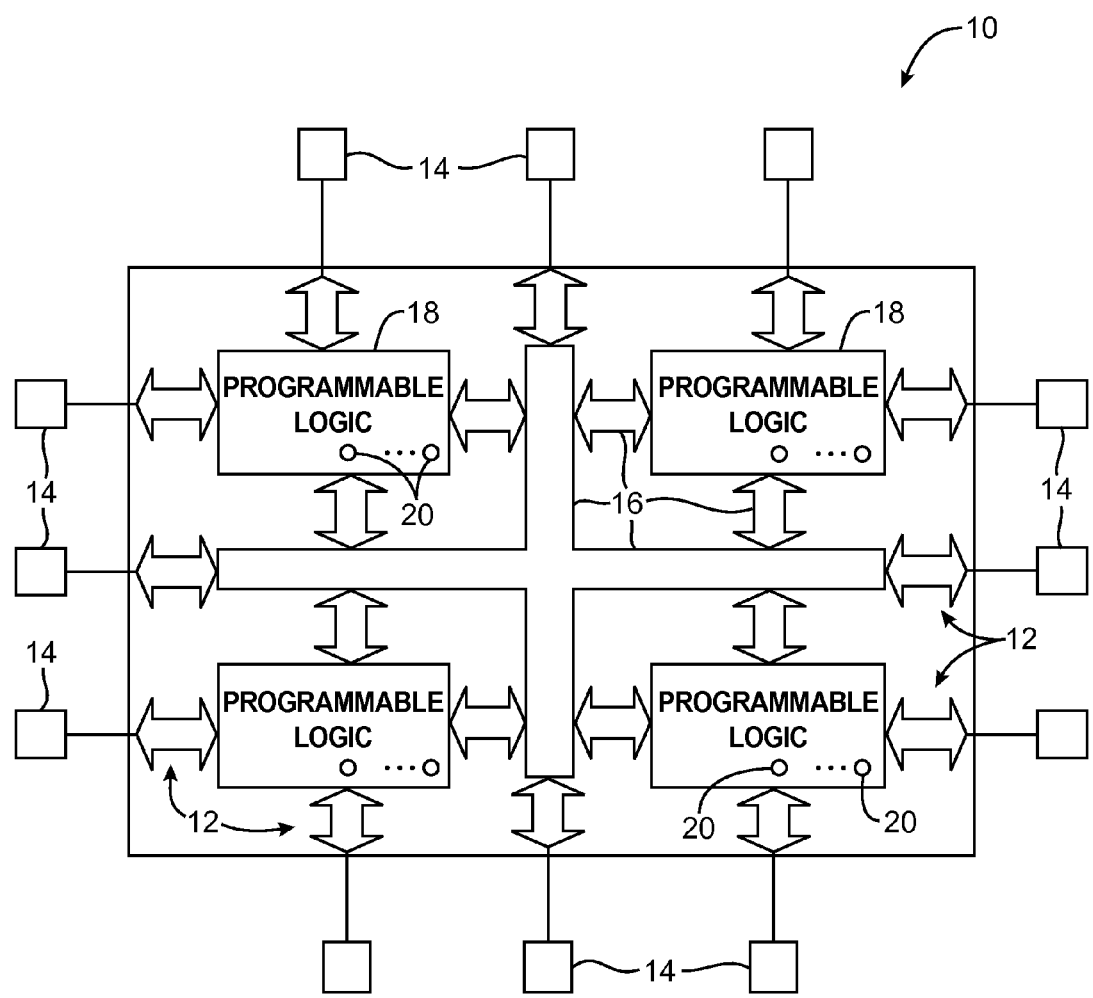
FIG. 1 is a diagram of an illustrative integrated circuit that may contain pass transistor structures in accordance with an embodiment of the present invention.

An illustrative integrated circuit that may contain asymmetric transistors such as asymmetric pass transistors is shown in FIG. 1. As shown in FIG. 1, integrated circuit 10 may include memory elements 20. Memory elements 20 may produce static control signals that are applied to the gates of asymmetric transistors to control their operation. For example, if a memory element is storing a logic one (e.g., a high voltage equal to a positive power supply voltage level Vcc such as 0.85 volts), the memory element can take the gate of an asymmetric transistor to a high voltage level (e.g., Vcc). If the memory element is storing a logic zero (e.g., a low voltage equal to a ground voltage supply Vss such as 0 volts), the memory element can take the gate of the asymmetric transistor to a low voltage level (e.g., Vss). Control signals for the gates of asymmetric transistors can also be produced using logic circuits. These signals may, for example, be dynamic control signals that are produced in real time based on internal and external inputs.

The voltage on the gate of an asymmetric transistor controls its state. For example, if the asymmetric transistor is an n-channel metal-oxide-semiconductor (NMOS) pass transistor, application of a logic one to the gate of the asymmetric transistor will enable the transistor and allow the transistor to pass signals from is source to drain. Application of a logic zero to the gate of the transistor will disable the transistor and prevent it from passing signals. By application of appropriate static and dynamic control signals to the pass transistors on an integrated circuit, the pass transistors can be directed to form desired signal interconnect patterns on the integrated circuit.

The integrated circuits in which asymmetric transistors such as asymmetric pass transistors are used can be any suitable integrated circuits that use transistors. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. The asymmetric transistors may be used in memory, in logic circuits, in interconnect routing circuits, in multiplexers (e.g., multiplexers in programmable interconnects), or any other suitable circuitry on an integrated circuit. For clarity, the use of asymmetric transistors to form pass transistors of the type that may be controlled by dynamic control signals and static control signals from memory elements 20 is sometimes described in the context of programmable integrated circuits such as programmable logic device integrated circuits. This is, however, merely illustrative. Asymmetric transistors such as asymmetric pass transistors may be used in any suitable circuits.

In programmable integrated circuits such as programmable logic device integrated circuits, memory elements 20 can be used to store configuration data (also sometimes referred to as programming data) and are therefore sometimes referred to in this context as configuration random-access memory (CRAM) cells. By loading CRAM cells with configuration data, the states of pass transistors and other components that are controlled by the CRAM cells can be customized to implement a desired logic function.

As shown in FIG. 1, device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18. These programmable interconnects and interconnection resources may contain asymmetric pass gates, buffers, conductive lines that span all or part of the width or height of integrated circuit 10, etc.

Integrated circuit 10 may contain memory elements 20. For example, integrated circuit 10 may be a programmable integrated circuit such as a programmable logic device integrated circuit that can be loaded with configuration data (also called programming data) using pins 14 and input/output circuitry 12. Once memory elements 20 are loaded in this way, the memory elements each provide a corresponding static control output signal that controls the state of an associated pass transistor or other logic component.

Each memory element 20 may be formed from a number of transistors configured to form a bistable circuit (i.e., a latch-type circuit). True and complement data storage nodes in the bistable circuit element can store corresponding true and complement versions of a data bit.

A bistable circuit element may be based on any suitable number of transistors. For example, the bistable portion of each memory element may be formed from cross-coupled inverters, from groups of multiple inverter-like circuits (e.g., in a distributed configuration that provides enhanced immunity from soft-error-upset events, etc.). Arrangements with bistable elements formed from cross-coupled inverter pairs are sometimes described herein as an example. This is, however, merely illustrative. Memory elements 20 may be formed using any suitable memory cell architecture.

With one suitable approach, complementary metal-oxide-semiconductor (CMOS) integrated circuit technology is used to form the memory elements 20, so CMOS-based memory element implementations are described herein as an example.

If desired, other integrated circuit technologies may be used to form the memory elements 20 and the other circuitry of integrated circuit 10.

The memory elements may be loaded from any suitable source of data. As an example, memory elements 20 may be loaded with configuration data from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable interconnects and other programmable logic circuitry on device 10 to control those elements (e.g., to turn certain transistors on or off) and thereby configure the circuitry. The circuit elements may be transistors such as pass transistors, pass transistors that form parts of multiplexers, look-up tables, logic arrays, AND, OR, NAND, and NOR logic gates, etc.

The memory elements 20 may be arranged in an array pattern. In a typical modern integrated circuit such as a programmable integrated circuit, there may be millions of memory elements 20 on each chip. During programming operations, an array of memory elements may be provided with configuration data by a user (e.g., a logic designer). Once loaded with configuration data, memory elements 20 produce static control signals at their outputs that selectively control portions of the circuitry on device 10 and thereby customize its functions so that it will operate as desired.

The circuitry of device 10 may be organized using any suitable architecture. As an example, the logic of device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2.

Figure 2:
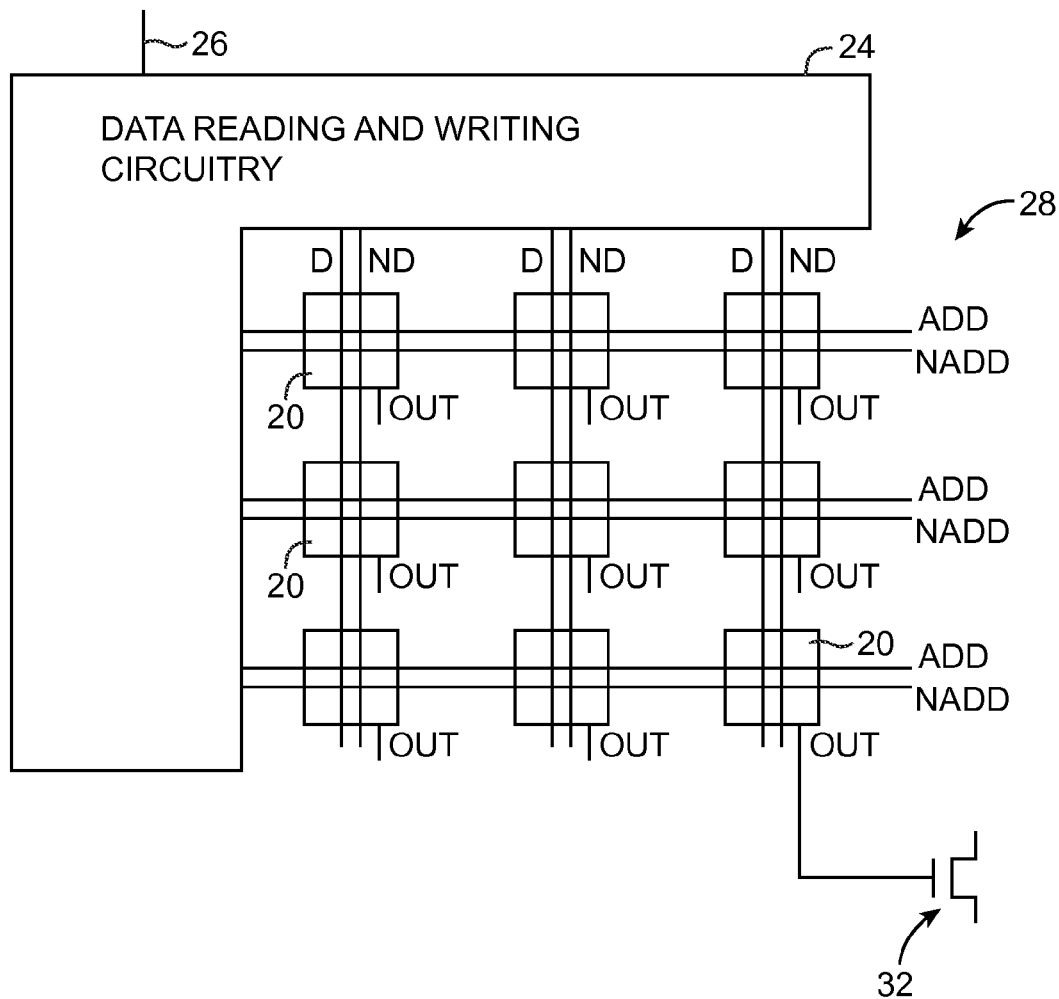
FIG. 2 is a diagram of an illustrative array of memory cells in accordance with an embodiment of the present invention.

As shown in FIG. 2, control circuitry 24 may be used to read and write data from memory cells 20 in memory cell array 28. Data that is to be written to the memory elements of array 28 may be obtained from path 26 (e.g., from an external or internal data source). Data that is read from array 28 may be provided to path 26 for internal or external processing.

Data write operations may be performed to load configuration data and data read operations may be performed to confirm that configuration data loading operations have been performed successfully. During normal operation of a circuit that contains an array of CRAM cells (i.e., when CRAM cells are neither being written to or read from), the static output of each CRAM cell can be used to control a respective programmable logic component such as a transistor. For example, the output signal OUT from each cell 20 may be provided to the gate G of a corresponding n-channel or p-channel transistor.

In the example of FIG. 2, the signal OUT from the memory element in the lower right corner of array 28 is being applied to the gate G of transistor 32. Transistor 32 may be a pass transistor such as n-channel metal-oxide-semiconductor transistor 32. Pass transistor 32 may, for example, be an asymmetric transistor that is used in a programmable interconnect circuit such as a programmable multiplexer or other programmable logic circuit.

Array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

Data lines and address lines may be used to distribute signals in array 28. Clear lines and other control lines may also be used in array 28. The number of each of these control lines and the configuration in which these control lines are used depends on the type of addressing and data access scheme is being used. The illustrative arrangement of FIG. 2 uses differential data signals carried over true data lines D and complement data lines ND and uses differential address signals carried over true address lines ADD and complement address lines NADD. No clear lines are used in this scheme.

In general, one or more data lines per column may be used to load data into cells 20 and may be used to read data out from cells 20. The data lines in array 28 may sometimes be referred to as bitlines. One or more address lines per row may be used to convey address signals and may sometimes be referred to as access transistor control lines or word lines. In some array configurations, the cells of the array may be cleared (e.g., during power-up operations). Array 28 may be cleared by writing zeros into the array using through the data lines. Schemes may also be used in which clear operations are implemented by asserting one or more global clear signals using a global (or nearly global) network of clear lines.

During data writing operation, write drivers in circuitry 24 may supply data to array 28 on the data lines (e.g., in appropriate columns of the array) while appropriate address lines are asserted to define the desired array location (i.e., the appropriate rows of the array) to which the data is to be written. During read operations, appropriate address lines are asserted to define the desired array location from which data is to be read (i.e., appropriate rows) while the outputs of appropriate data lines are monitored (e.g., using sense amplifiers). Single-ended and differential schemes may be used for reading and/or writing. In differential write schemes such as the scheme used in array 28 of FIG. 2, a pair of true and complement data lines are used. In differential read schemes, a differential sense amplifier may be used in reading signals from a pair of true and complement data lines.

Figure 3:
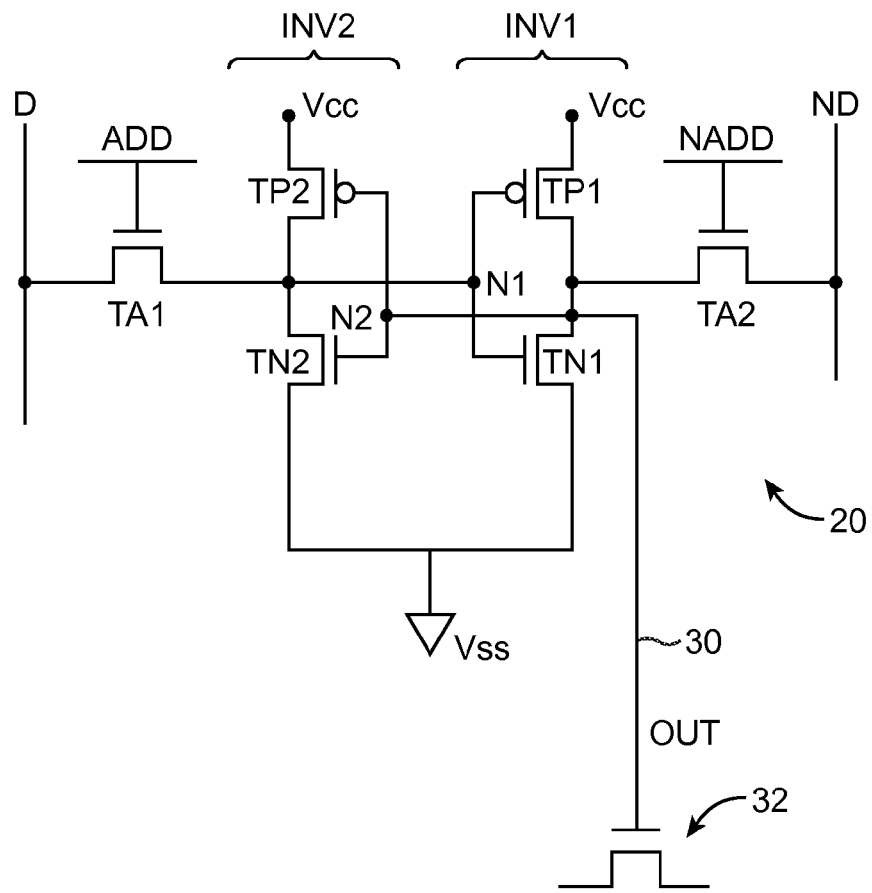
FIG. 3 is a diagram of an illustrative memory element being used to control a pass transistor in accordance with an embodiment of the present invention.

Memory cells 20 may be based on any suitable bistable circuit. An illustrative memory cell circuit that may be used for memory cells 20 is shown in FIG. 3. In the illustrative example of FIG. 3, memory cell 20 is based on a pair of cross-coupled inverters. Inverter INV1 has an input and an output. Inverter INV2 has an output (node N1) that is coupled to the input of inverter INV1 and has an input (node N2) that is coupled to the output of inverter INV1. When connected in this way, inverters INV1 and INV2 are said to be cross coupled and form a bistable data storage element. Data can be stored on nodes N1 and N2. The state of the logic bits stored on nodes N1 and N2 are complementary. For example, if node N1 is storing a logic one (i.e., a signal at positive power supply voltage Vcc), node N2 will be storing a logic zero (i.e., a signal at ground power supply voltage Vss).

The values of Vss and Vcc that are used in powering cell 20 may be selected based on the type of process that is used in manufacturing circuit 10. As an example, Vcc might be 0.85 volts and Vss might be 0 volts. Other voltage levels may be used if desired.

Data is written and read from cell 20 using true data line D and complement data line ND. Address transistors (access transistors) TA1 and TA2 may be used in controlling the transfer of data between lines D and ND and nodes N1 and N2, respectively. The gates of transistors TA1 and TA2 are controlled by address signals ADD and NADD.

Once loaded with data, (e.g., once node N2 has been loaded with a desired logic value), a corresponding control signal (having the value of the data bit loaded on node N2) may be applied to the gate of transistor 32 by path 30. Transistors such as transistor 32 may also be controlled by control signals from other sources, such as dynamic control signals from logic circuitry on device 10 or external control signals.

Figure 4:
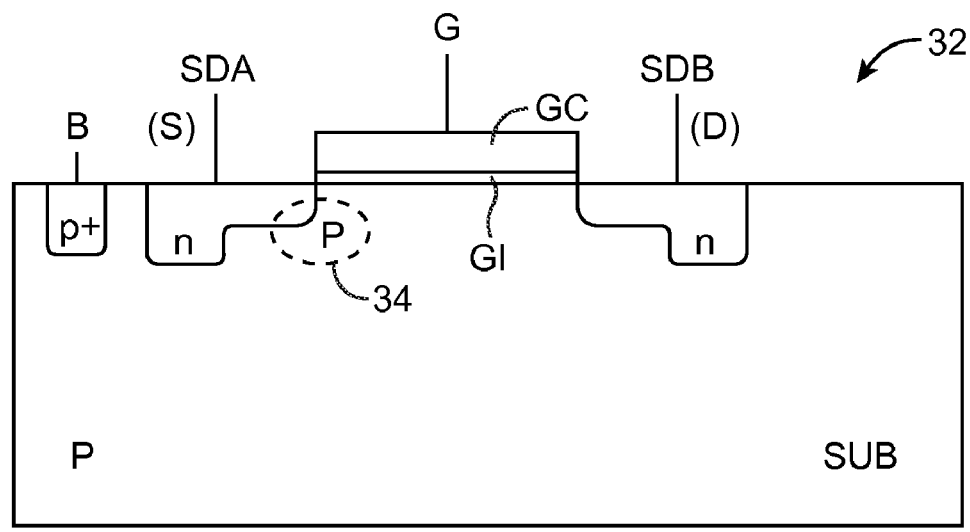
FIG. 4 is a cross-sectional side view of an asymmetric transistor in accordance with an embodiment of the present invention.
Figure 5:
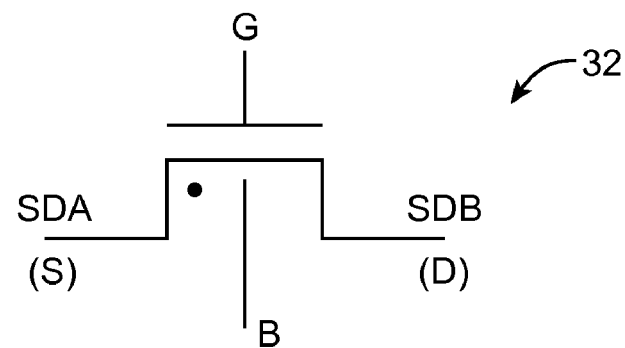
FIG. 5 is a circuit diagram of an asymmetric transistor of the type shown in FIG. 4 in accordance with an embodiment of the present invention.

To enhance performance, transistor 32 may be formed using an asymmetric transistor structure. A cross-sectional side view of an illustrative transistor 32 that has been formed using an asymmetric transistor structure is shown in FIG. 4. A corresponding circuit diagram for the asymmetric transistor of FIG. 4 is shown in FIG. 5.

Metal-oxide-semiconductor (MOS) transistor 32 of FIG. 4 is an n-channel transistor. This is, however, illustrative. Asymmetric transistors such as transistor 32 may be formed with p-channels if desired.

Asymmetric transistor 32 of FIG. 4 has four terminals: a source S, a drain D, a gate G that overlies a channel region in substrate SUB, and a body B. Substrate SUB is formed from p-type semiconductor (e.g., p-type silicon). Body B may be formed form a p+ terminal region in substrate SUB. Source S and drain D may be formed form n-type regions in substrate SUB. The gate G (sometimes referred to as the gate terminal) for transistor 32 may have one or more fingers. Each finger (sometimes called a "gate structure") of gate G may have a gate conductor GC and gate insulator GI. Gate conductor GC may be formed from doped polysilicon, metal, or other suitable conductive materials. Gate insulator GI may be formed from silicon oxide, hafnium-based oxides, or other suitable insulating materials.

By convention, the drain of an MOS transistor is typically the source-drain terminal that is biased high, whereas the source is grounded or biased at a lower voltage. Because the labels "source" and "drain" may therefore be context-sensitive, it may sometimes be clearest to refer to the both the source and the drain of a MOS transistor as being "source-drain" terminals or "source-drains." The source and drain of the asymmetric transistors in device 10 are therefore sometimes collectively referred to as source-drain terminals and are labeled SDA and SDB in the drawings such as the drawing of FIG. 4.

In a symmetric transistor, the source-drain terminals of the transistors are substantially identical. It therefore does not matter whether the source-drain terminals of a symmetrical transistor are reversed, as performance will not significantly change. In an asymmetric transistor, however, there is an energy barrier at one of the source-drain terminals that is not present at the other of the source-drain terminals. This leads to different performance characteristics depending on how the transistor is operated.

Asymmetric transistors may be formed by adjusting the sizes, shapes, and materials of the structures that make up the transistor. With the illustrative arrangement of FIG. 4, an asymmetric transistor structure has been formed by making a one-sided energy-barrier-inducing pocket implant (e.g., a p-type implant) in pocket implant doping region 34. Because the pocket implant and associated energy barrier have been formed at source-drain SDA in this example, the schematic diagram of transistor 32 in FIG. 5 has a corresponding dot symbol at source-drain SDA. This convention (i.e., the use of an asymmetric transistor where SDA has an energy barrier from a pocket implant or other source whereas SDB does not have this energy barrier) is used in the following examples.

Figure 6:
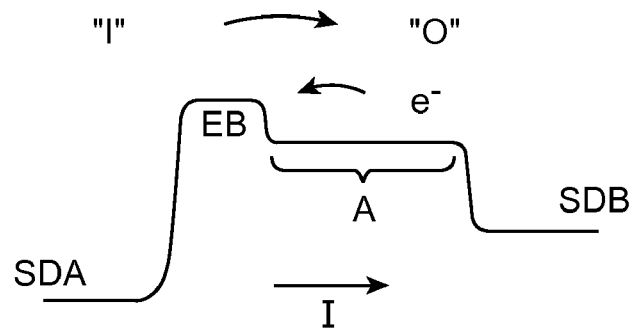
FIG. 6 is a band diagram of an asymmetric transistor showing how a strongly asymmetric transistor might operate in a strong mode when passing a signal that is transitioning from a logic zero to a logic one in accordance with an embodiment of the present invention.
Figure 7:
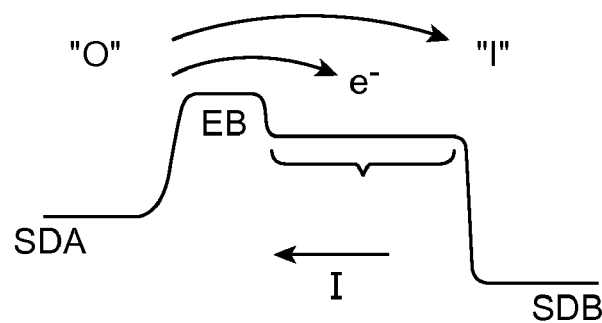
FIG. 7 is a band diagram of an asymmetric transistor showing how a strongly asymmetric transistor might operate in a weak mode when passing a signal that is transitioning from a logic one to a logic zero in accordance with an embodiment of the present invention.

The asymmetric performance of an asymmetric transistor may be understood with reference to the energy band diagrams of FIGS. 6 and 7.

When driving a logic one from source-drain SDA to source-drain SDB (i.e., when a pass transistor is passing the rising edge portion of a logic signal as the signal transitions from low to high), electrons initially need not overcome barrier EB. Rather, electrons may accelerate due to the electric field present in region A. After accelerating in region A, the electrons can surmount energy barrier EB with relative ease. The configuration of FIG. 6 therefore represents a configuration in which the asymmetric transistor is relatively strong (i.e., the transistor is operating in a "strong mode").

When driving a logic zero from source-drain SDA to source-drain SDB (i.e., when a pass transistor is passing the falling edge portion of a logic signal as the signal transitions from high to low), however, electrons are initially required to surmount energy barrier EB, before reaching region A. This condition, which is illustrated in FIG. 7, is less favorable than the situation in FIG. 6 and results in a lower current I for a given applied gate voltage than the situation in FIG. 6. The configuration of FIG. 7 therefore represents a configuration in which the asymmetric transistor is weaker than in the configuration of FIG. 6 (i.e., the transistor is operating in a "weak mode").

All other factors being equal, an asymmetric transistor 32 of the type shown in FIGS. 4 and 5 in which source-drain terminal SDA serves as a signal input and source-drain terminal SDB serves as a signal output would tend to exhibit fall times that are slower than its rise times. This property can be used to compensate for the inherent weakness of conventional NMOS transistors when passing logic ones, as described in more detail in connection with FIGS. 8, 9, and 10.

Figure 8:
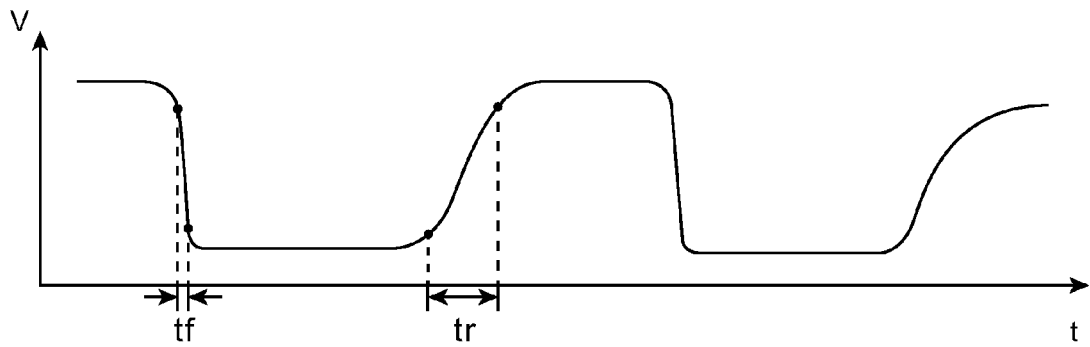
FIG. 8 is a graph showing how a conventional n-channel metal-oxide-semiconductor pass transistor may cause logic signals that are passing through the pass transistor to exhibit slower rising edges than falling edges thereby slowing overall performance of the pass transistor.

FIG. 8 is a graph of a train of logic pulses (i.e., "1s" and "0s") passing through a conventional NMOS pass gate. The voltage of the logic signal V is plotted as a function of time t. The rise time of the signal that has passed through the pass gate is tr and the fall time of the signal that has passed through the pass gate is tf. A typical rise time might be 100 ps and a typical fall time might be 10 ps. As shown in the graph of FIG. 8, a conventional NMOS transistor will therefore be slower when transitioning between zero and one than when transitioning between one and zero. This is because the gate source voltage Vgs of a conventional NMOS transistor tends to fall and the threshold voltage Vt tends to rise when passing a one.

Figure 9:
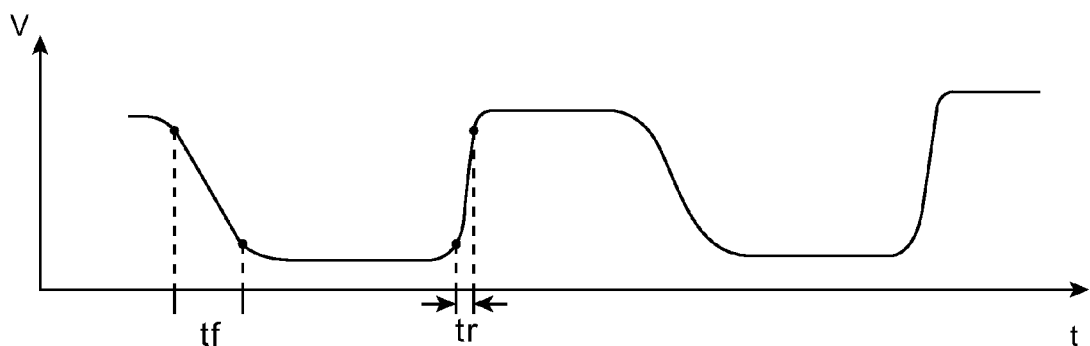
FIG. 9 is a graph showing how an asymmetric transistor might be used in a circuit to shorten signal rise times in accordance with an embodiment of the present invention.

FIG. 9 is a graph of an asymmetric transistor of the type shown in FIGS. 4 and 5 in which a relatively large energy barrier EB has been formed by using a relatively large pocket implant 34. Because the energy barrier is relatively large (in this example) the presence of the energy barrier has a controlling influence on the performance of the asymmetric transistor. In particular, because the energy barrier is large, the asymmetric transistor is significantly weaker when passing a signal that is transitioning from a one to a zero than when passing a signal that is transitioning from a zero to a one. This is the opposite of the behavior expected from a conventional NMOS pass transistor. As a result, the fall time tf of the logic signal passing through the asymmetric transistor will be larger than the rise time tr of the logic signal passing through the asymmetric transistor.

In the hypothetical FIG. 9 example, the impact of the asymmetry of the transistor was exaggerated so that the fall time tf was larger than rise time tr. The fall time tf might be 100 ps and the rise time tr might be 10 ps. In both the conventional example of FIG. 8 and the hypothetical unbalanced arrangement of FIG. 9, the total signal delay time (tr+tf) is about 110 ps.

Figure 10:
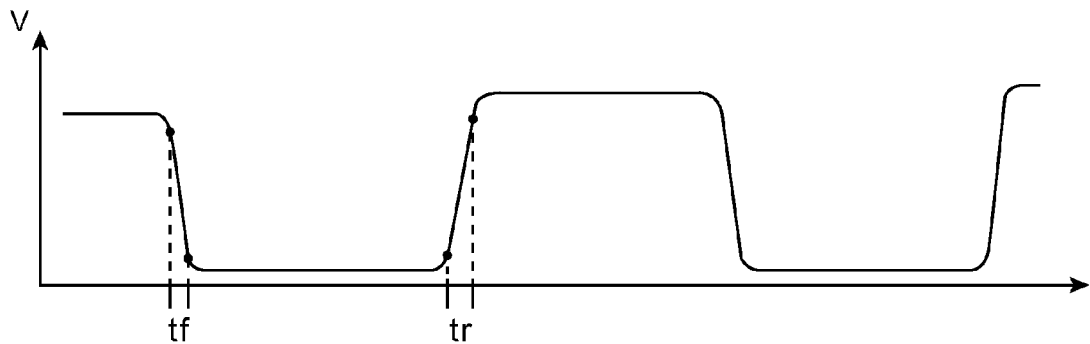
FIG. 10 is a graph showing how a more balanced asymmetric transistor than the transistor of FIG. 9 may help reduce overall signal delay times by reducing signal rise times relative to conventional transistors without excessively increasing signal fall times in accordance with an embodiment of the present invention.

Improvements can be obtained by using an asymmetric transistor with a somewhat smaller energy barrier EB. When the amount of dopant in the pocket implant in region 34 (FIG. 4) is reduced, the energy barrier EB will not be excessive and the asymmetric transistor will pass signals that exhibit more balanced rise and fall times. This type of configuration is shown in FIG. 10. As shown in FIG. 10, use of a smaller energy barrier EB in asymmetric transistor 32 has resulted in a fall time tf and a rise time tr that are substantially equal. This results in a total signal delay time (tr+tf) that is less than the conventional arrangement of FIG. 8. Asymmetric transistors 32 of this type may, for example, be about 20% faster than conventional NMOS pass gates for an equal leakage current. If desired, leakage current performance can also be improved by increasing transistor threshold voltage Vt in an asymmetrical design (albeit with some tradeoff in the expected speed increase).

In the example of FIG. 10, tr and tf are equal. Balanced designs need not, however, exhibit perfectly equal values of tr and tf. Acceptable performance may, for example, be obtained in which the values of tr and tf differ by +/−10% or less, by +/−20% or less, by +/−50% or less, or by even larger differences).

Energy barrier EB may be formed using a pocket implant such as implant 34 of FIG. 4. During semiconductor fabrication operations, a photoresist mask on substrate SUB may be used to ensure that implant 34 is formed under at source-drain SDA, but not source-drain SDB. If desired, other techniques for forming asymmetric transistors for integrated circuit 10 may be used.

With one suitable arrangement, asymmetric transistors may be formed by proper selection of the layout of the transistors on integrated circuit 10. The gates of the transistors 10 may, for example, be arranged so that different temperatures develop under different source-drain regions during dopant activation. This technique may cause pocket implants that are initially symmetric to diffuse unevenly, resulting in asymmetric pocket implant doping and an asymmetric energy barrier.

This type of approach is illustrated in the cross-sectional semiconductor fabrication diagrams of FIGS. 11, 12, 13, and 14. During fabrication of integrated circuit 10, integrated circuit 10 may be processed using techniques such as ion implantation, heat treatments, photolithographic patterning, and material deposition and etching techniques. The processes illustrated in FIGS. 11, 12, 13, and 14 are merely illustrative. Other arrangements may be used for forming asymmetric transistors on integrated circuit 10 if desired.

Figure 11:
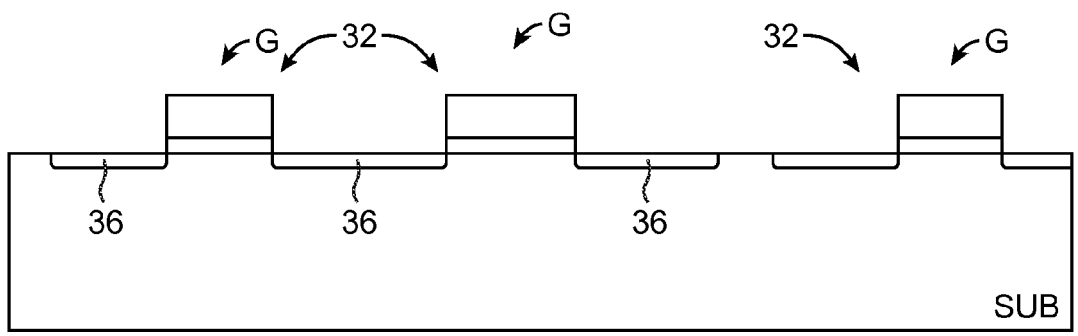
FIGS. 11, 12, 13, and 14 are cross-sectional side views of a portion of an integrated circuit containing asymmetric transistors showing how the transistors may be formed in accordance with an embodiment of the present invention.

As shown in FIG. 11, the process of fabricating asymmetric transistors 32 may involve forming a shallow source-drain doping region 36. Doping region 36 may, for example, be formed from a shallow n-type implant in a p-type substrate SUB.

Figure 12:
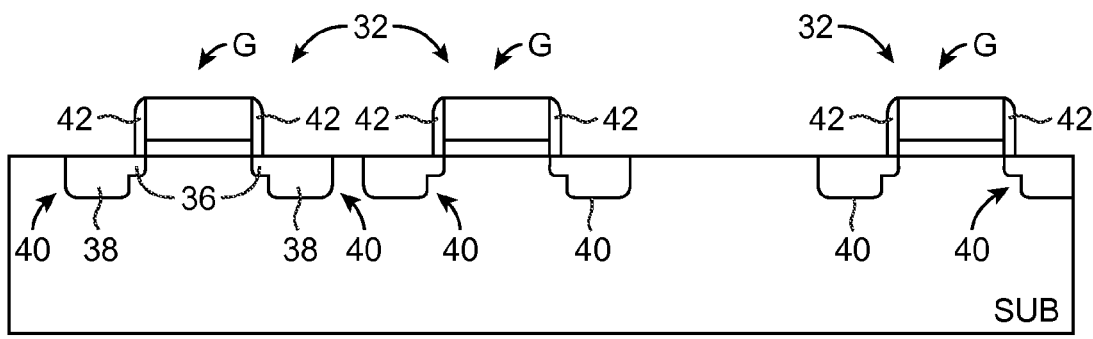

A series of oxide spacers 42 may then be formed around gates G and deep implant region 38 may be formed, as shown in FIG. 12. Deep implant 38 may be, for example, an n-type implant that extends the boundaries of shallow implant 36 to form n-type source-drain regions 40 of the type shown in FIG. 12.

Figure 13:
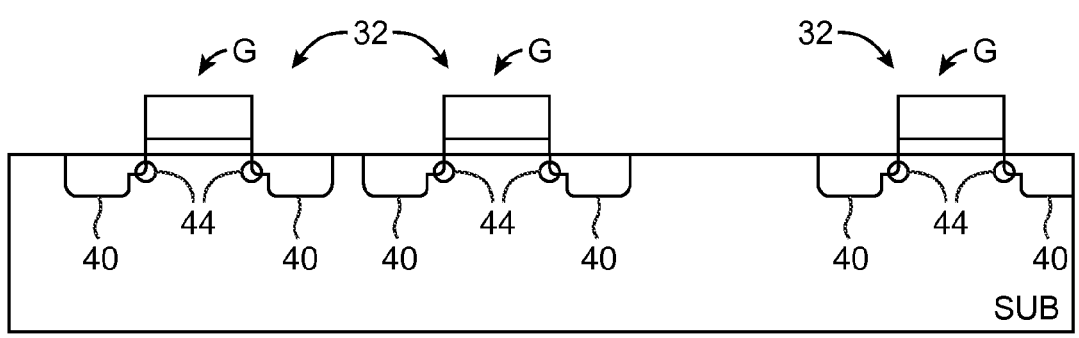

As shown in FIG. 13, spacers 42 may be removed and symmetrical pocket implants 44 may be formed in substrate SUB at each source-drain region. The symmetrical pocket implants are symmetrical because identical pocket implant structures are formed on opposing sides of each gate. Pocket implants 44 may, for example, be p+ implants that are formed while rotating substrate SUB (i.e., the wafer from which SUB is formed) at an angle relative to the ion beam in an ion implantation tool. Subsequent thermal processing will give rise to asymmetry, so there is no need for photoresist masking layers to selectively block the pocket implant dopant from one of the source-drain regions in each transistor 32.

After symmetrical pocket implants 44 of FIG. 13 have been formed, substrate SUB may be heated. Heating may be performed using a rapid thermal annealing (RTA) tool that applies heat to substrate SUB using an infrared lamp or using other suitable semiconductor fabrication tools. The heating process activates the dopant in the pocket implants and causes the dopant to diffuse.

Figure 14:
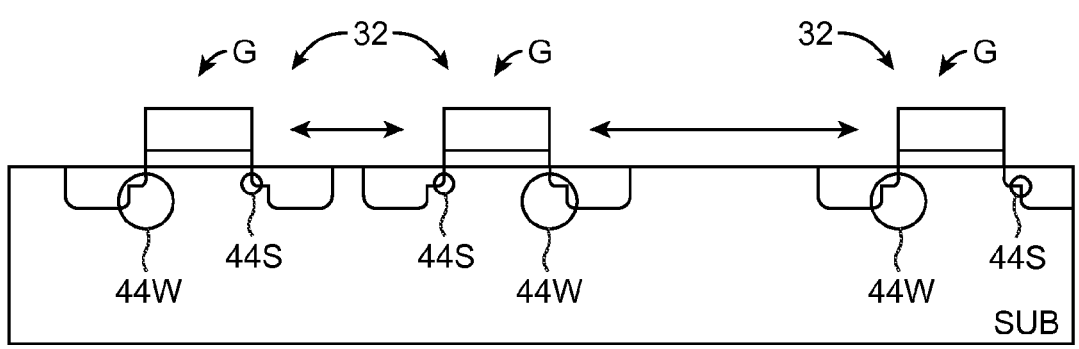

As shown in FIG. 14, the layout of the gates G that are associated with transistors 32 distributes gates G so that some of gates G are more closely spaced from adjacent gates than others. Closely spaced gates reflect more heat per unit area from the rapid thermal annealing tool than gates that are spaced farther apart, so the amount of heat that is absorbed in substrate SUB varies across the surface of substrate SUB.

In the source-drains near to closely spaced adjacent gates, more heat is reflected, the substrate temperature rise is lower, and the pocket implants diffuse less into their surroundings, thereby forming relatively strongly concentrated pocket implants 44S. In the source-drains whose adjacent gates are farther apart, less heat is reflected, the substrate temperature rise is greater, and the pocket implant diffuses more into its surroundings, thereby forming a relatively weakly concentrated pocket implant doped region 44W.

Once heating is complete (FIG. 14), each transistor 32 has a strong implant 44S at one of its source-drain terminals and has a weak implant 44W at one of its source-drain terminals. Because the dopant of weak implant 44W is more diffuse than the dopant of strong implant 44S, strong implant 44S gives rise to an energy barrier EB as described in connection with FIGS. 4, 5, 6, and 7, while weak implant 44W does not give rise to an energy barrier or at gives rise to only a small energy barrier, so that there is a net energy barrier EB on the strong-implant side of the transistor (equivalent to no energy barrier on the weak implant side). The relative concentrations of the dopant between the strong and weak energy-barrier doping regions therefore gives rise to an asymmetric transistor (i.e., a transistor having an energy barrier EB at source-drain SDA as shown in FIGS. 4 and 5).

Figure 15:
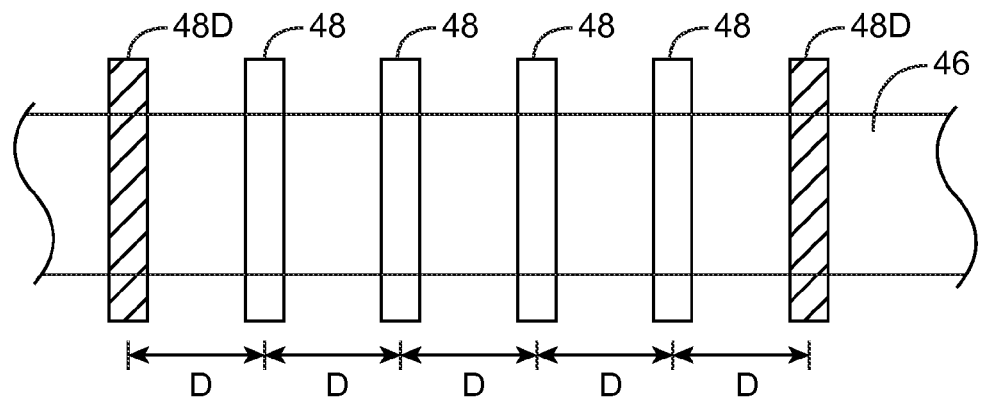
FIG. 15 is a top view of a conventional transistor layout for an integrated circuit.

FIG. 15 is a top view of a conventional gate layout for conventional symmetric transistors. As shown in FIG. 15, a typical transistor layout involves the use of multiple evenly-spaced gates 48 (including evenly-spaced dummy gates 48D) across source-drain doping region 46. Each gate is located at a distance D from the next. As a result, the heat that is induced in the source-drain regions (in region 46) is distributed symmetrically across each gate during rapid thermal annealing operations.

Figure 16:
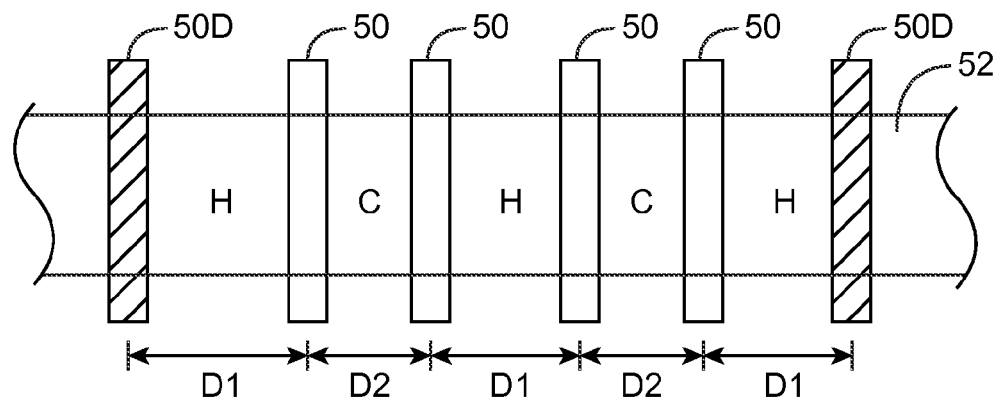
FIG. 16 is a top view of a transistor layout that may be used in forming asymmetric transistors such as asymmetric pass gates on an integrated circuit such as a programmable integrated circuit in accordance with an embodiment of the present invention.

FIG. 16 is a top view of an illustrative layout that may be used in producing asymmetric transistors for integrated circuit 10. In the illustrative layout of FIG. 16, gates 50 (including dummy gates 50D) are arranged at unequal distances from each other along rectangular stripe-shaped source-drain doping region 52. The gates in an asymmetric transistor may each be formed from a single gate finger (sometimes referred to as a single gate structure) or may each be formed from multiple gate fingers (sometimes referred to as multiple gate structures). Gates G are therefore sometimes referred to as gate structures.

Each gate structure 50 in FIG. 16 is arranged so that it spans strip-shaped source-drain region 52. In the dimension perpendicular to the longitudinal axis of each gate structure (i.e., the dimension running parallel to strip 52), gate structures G (i.e., pairs of adjacent gate structures) have unequal spacings. Some pairs of adjacent gate structures are spaced closer together than others. Gate structures 50 (i.e., gates G of FIGS. 4 and 5) contain materials such as metal or polysilicon that reflect heat from the underlying material of substrate SUB. As a result, the spacing between adjacent pairs of gate structures affects the amount of heat that is absorbed into substrate SUB per unit area during heating (i.e., during rapid thermal annealing with an RTA tool or other tool with which infrared light is applied to the surface of substrate SUB).

In a typical arrangement of the type shown in FIG. 16, the transistor gate structures will be characterized by some gate-structure-to-gate-structure distances D1 and some gate-structure-to-gate-structure distances D2, where D2 is less than D1. D1 may be, for example, 110 nm and distance D2 of 85 nm (as an example). Other distances may be used if desired. In comparison, a conventional arrangement of the type shown in FIG. 15 might have equal distances D, so that the size of D is the same between each respective pair of adjacent gates.

The portions of source-drain region 52 that lies between gate structures that are separated by distance D1 are labeled H in FIG. 16. The portions of source-drain region 52 that lie between gate structures that are separated by distance D2 are labeled C in FIG. 16. Because distance D1 is greater than distance D2, more heat is absorbed in the H source-drain regions than in the C source-drain regions. The H regions are therefore hotter than the C regions, which causes the pocket implant doped regions 44 to diffuse more in the H regions than in the C regions. This causes the 44S regions to form energy barrier EB, as described in connection with pocket implant 34 of FIG. 4.

Figure 17:
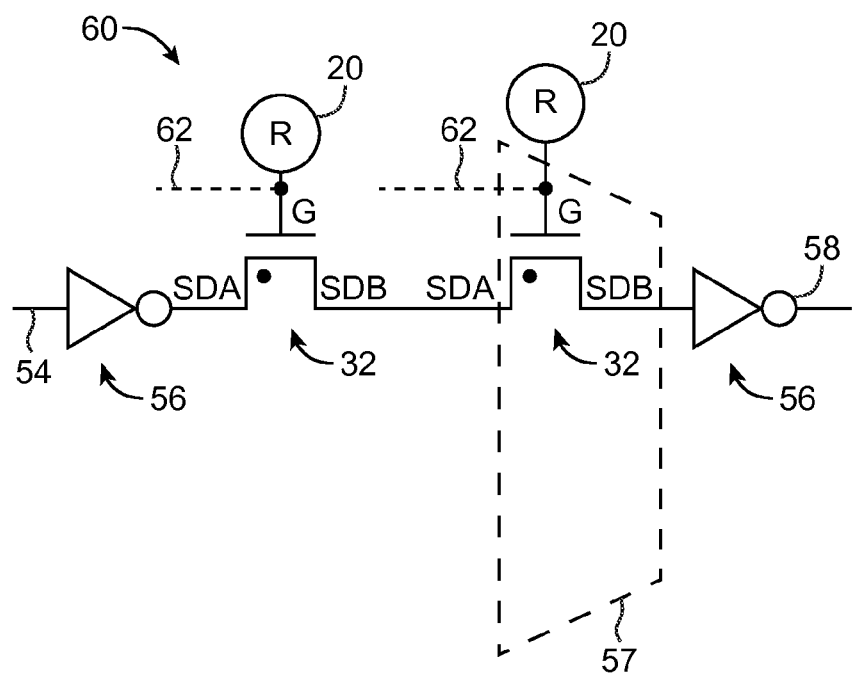
FIG. 17 is a circuit diagram of an illustrative circuit that contains asymmetric pass transistors and associated programmable memory elements that may be used to apply control signals to the gates of the pass transistors.

Asymmetric transistors 32 may be used in programmable multiplexers, logic gates, interconnects, logic elements, or any other suitable circuitry on integrated circuit 10. A typical interconnect circuit of the type that may use asymmetric transistors 32 as pass transistors is shown in FIG. 17. As shown in FIG. 17, circuit 60 may receive data (logic signals) at input 54 and may produce corresponding output signals at output 58. Input 54 may, for example, be connected to the output of a logic circuit, circuit 60 may be used as part of the interconnect fabric on integrated circuit 10, and output 58 may be connected to the input of another logic circuit.

Circuit 60 may include buffers such as inverters 56. Inverters 56 may each receive input signals at their input and may provide correspondingly strengthened versions of these input signals at their output, thereby helping to ensure that the signal strength of the signals passing through circuit 60 does not become degraded. One or more asymmetric transistors such as asymmetric pass transistors 32 may be coupled in circuit 60 between input 54 and output 58. As indicated by dashed line 57, transistors 32 may form part of a logic component such as a multiplexer. Each of these transistors may use its source-drain SDA as an input and may use its source-drain SDB as an output. The gate of each of the asymmetric pass transistors in circuit 60 may be coupled to the output of a respective memory element 20 to receive a corresponding static control signal. As indicated by dashed lines 62, dashed lines 62 represent paths that may be used to convey external control signals received from input-output pins on circuit 10 or that may be used to convey internal control signals, the gate of each asymmetric pass transistor 32 may also be provided with control signals (e.g., dynamic control signals) from other sources.

Integrated circuit 10 may contain both symmetric transistors and asymmetric transistors. The symmetric transistors may be protected (e.g., using patterned photoresist) during ion implantation of pocket implants or may be fabricated using even gate-to-gate spacings so that asymmetric heat profiles do not convert these symmetric transistors into asymmetric transistors.

Figure 18:
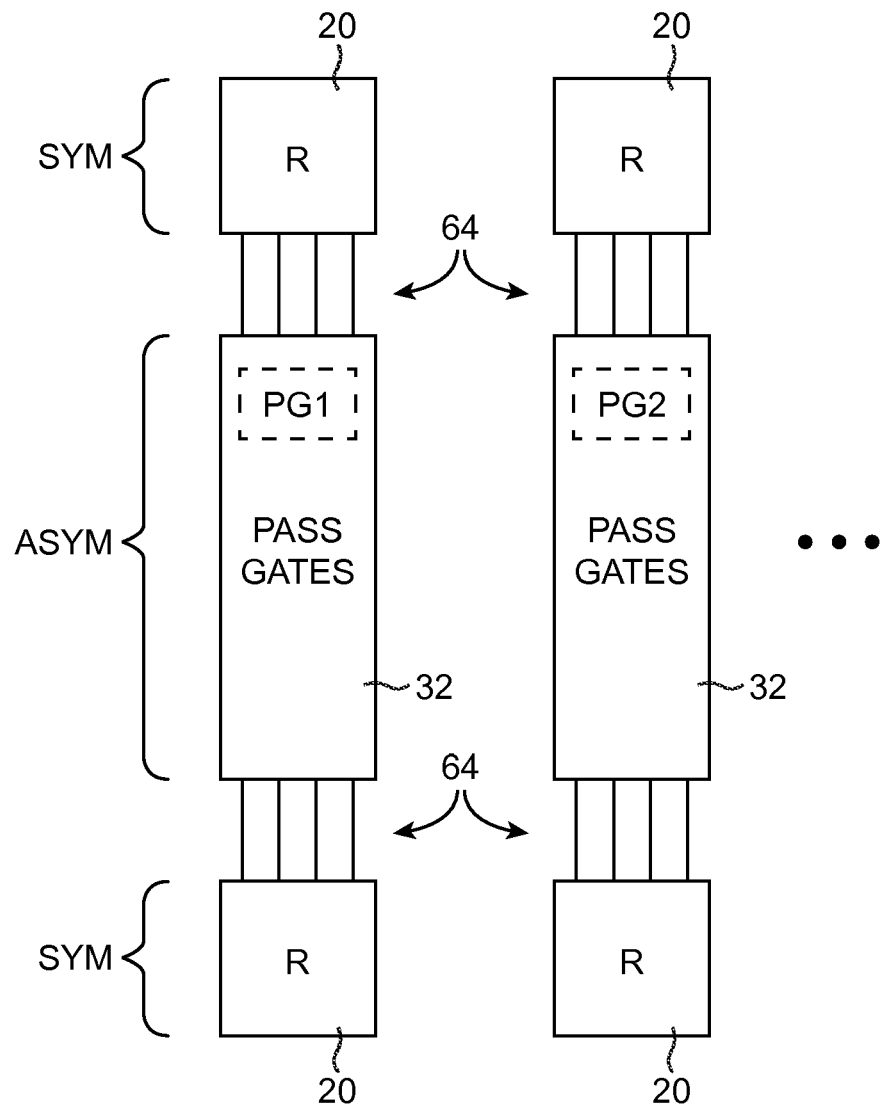
FIG. 18 shows an illustrative circuit layout that may be used in forming asymmetric pass transistors and associated memory elements on an integrated circuit such as a programmable integrated circuit in accordance with an embodiment of the present invention.

FIG. 18 is an illustrative layout that may be used on integrated circuit to form memory elements 20 and associated pass transistors 32 (e.g., to implement circuits of the type shown in FIG. 17). Memory elements 20 can be formed with asymmetric transistors (e.g., asymmetric address transistors such as transistors TA1 and TA2 of FIG. 3) or may be formed with symmetric transistors (as indicated by the label "SYM" in the example of FIG. 18). Pass gates 32 may be formed using asymmetric transistor structures. If desired, pass gates 32 may be formed in groups (e.g., with two, three, or more than three pass transistors formed between a pair of respective memory elements 20, as shown in FIG. 18). Conductive lines 64 may be used to distribute control signals from memory elements 20 to the gates of pass gates 32 (e.g., to form multiplexers or other circuits such as circuit 60 of FIG. 17).

Figure 19:
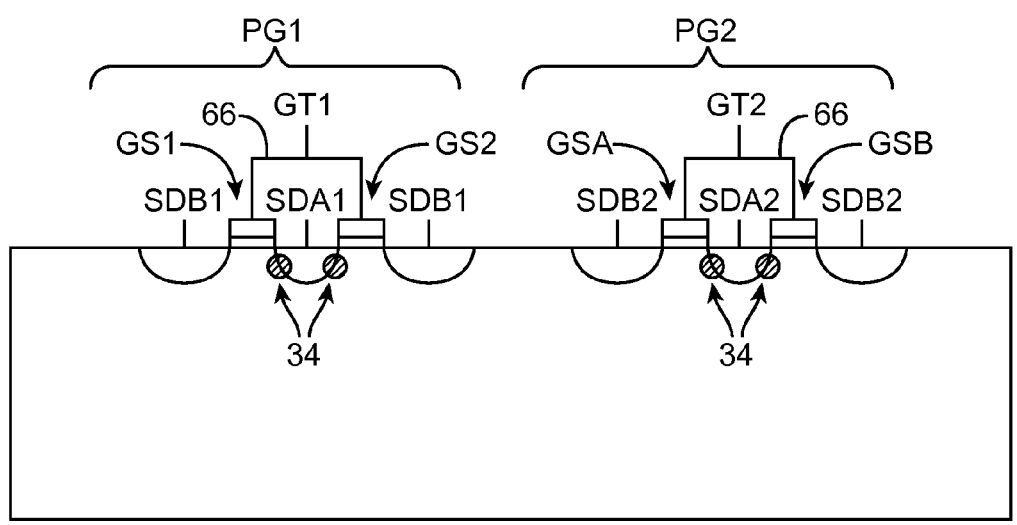
FIG. 19 is a cross-sectional side view of asymmetric pass transistors of the type that may be used in a circuit having a layout of the type shown in FIG. 18 in accordance with an embodiment of the present invention.

FIG. 18 shows the locations at which two pass gates (pass gates PG1 and PG2) may be formed. FIG. 19 is a cross-sectional side view of a portion of integrated circuit 10 showing how pass gates PG1 and PG2 may each be formed from a pair of respective gate structures (gate fingers). In particular, FIG. 19 shows how pass gate PG1 may be formed from gate structure GS1 and gate structure GS2. Gate structures GS1 and GS2 are shorted together by conductive path 66 to form gate GT1. FIG. 19 also shows how pass gate PG2 may be formed from gate structure GSA and gate structure GSB, which are shorted together by conductive path 66 to form gate GT2 for pass gate PG2. Gates GS1 and GS2 may be formed closer together than GS2 and GSA and gates GSA and GSB may be formed closer together than GSA and GS2, leading to the formation of pocket implants 34 on source-drain SDA1 and source-drain SDA2 following ion implantation and rapid thermal annealing, as described in connection with FIG. 16. In the example of FIG. 19, each pass transistor has a gate that was formed from two individual gate fingers. If desired, asymmetric pass transistors may be formed that have one finger, two fingers, three fingers, four fingers, or more than four fingers. The example of FIG. 19 is merely illustrative.

Figure 20:
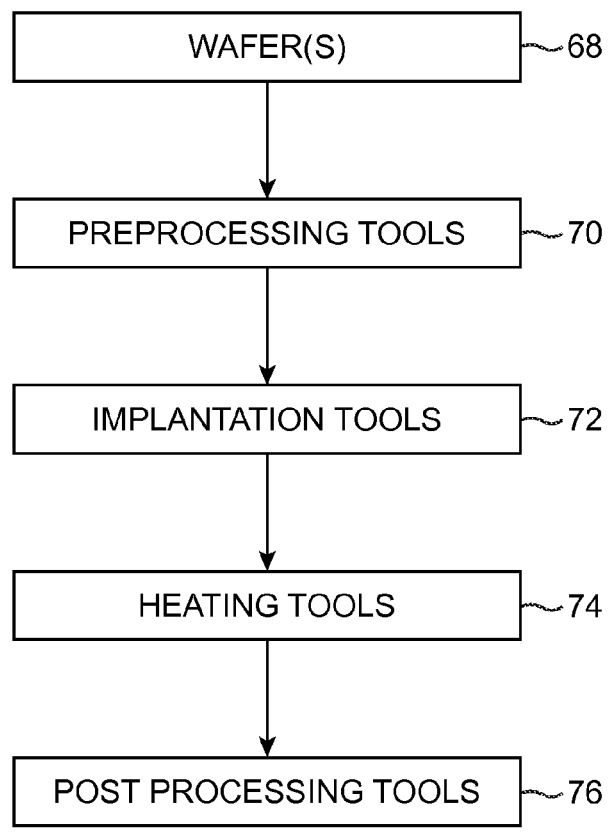
FIG. 20 is a diagram showing illustrative equipment that may be used in fabricating integrated circuits with asymmetric transistors in accordance with an embodiment of the present invention.

FIG. 20 shows illustrative equipment that may be used in forming integrated circuits with asymmetric transistors such as asymmetric pass transistors 32.

Using preprocessing tools 70, wafers 68 may be preprocessed to form structures of the type shown in FIG. 11 and FIG. 12. Preprocessing tools 70 may include photolithography tools, deposition tools, etching tools, heating tools, ion implantation tools, polishing tools, etc.

Ion implantation tools 72 or other suitable doping tools may be used in forming symmetrical doping regions such as regions 44 of FIG. 13 (i.e., regions of the same size and doping concentration on opposing sides of each gate structure).

To convert the symmetrical dopant of regions 44 into the asymmetrically distributed dopant of FIG. 14 (regions 44S and 44W), wafers 68 may be heated with heating tools 74. Heating tools 74 may, for example, include rapid thermal annealing tools that apply heat to wafers 68 by shining infrared (IR) light onto the top surface of each wafer.

Following heating of wafers 68 to form an energy barrier EB at each source-drain SDA and thereby forming asymmetric transistors 32, post-processing tools 76 may be used to complete fabrication of integrated circuit 10. Postprocessing tools 76 may include photolithography tools, deposition tools, etching tools, heating tools, ion implantation tools, polishing tools, dicing tools, bonding tools, packaging tools, etc.

Figure 21:
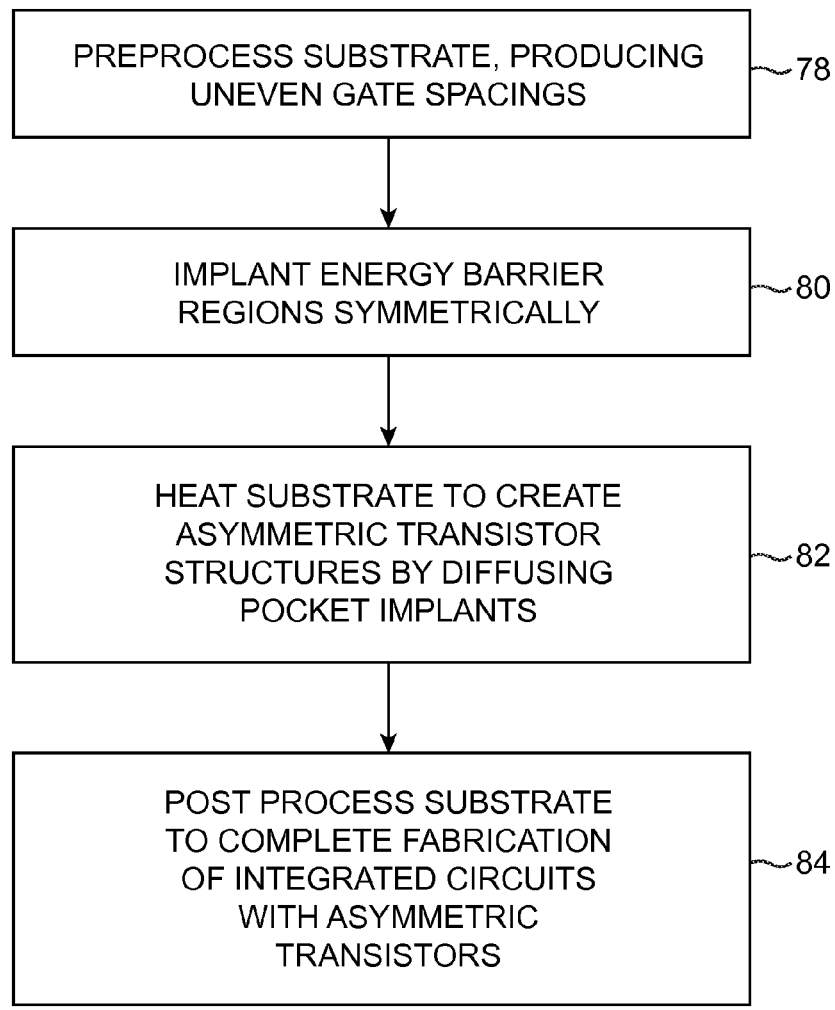
FIG. 21 is a flow chart of illustrative steps that may be used in fabricating integrated circuits with asymmetric transistors in accordance with an embodiment of the present invention.

Illustrative steps that may be used in forming asymmetric transistors using semiconductor processing equipment of the type shown in FIG. 20 are shown in FIG. 21.

At step 78, tools 70 may be used in processing semiconductor substrate SUB. Substrate SUB may be formed from part of a bulk silicon wafer, a silicon-on-insulator (SOI) wafer, or other semiconductor substrate material. Preprocessing operations at step 78 may be used to form transistor structures of the type shown in FIG. 12. As described in connection with FIGS. 16 and 19, the gate structures for at least some of the transistors structures that are formed during the operations of step 78 may have unequal gate-to-gate (gate-finger-to-gate-finger) spacings. Some of the gate structures (i.e., the gate conductors and associated gate insulators) may be spaced closer together than others (see, e.g., the pattern of FIG. 16).

At step 80, ion implantation equipment 72 (FIG. 20) may be used to form energy-barrier-forming doped regions 44 of FIG. 13 (e.g., pocket implants). Regions 44 may initially be symmetric, as shown in FIG. 13.

At step 82, a rapid thermal annealing tool or other tool may be used to apply infrared light to the substrate SUB, thereby heating substrate SUB. This causes locally hotter regions H and locally colder regions C to form within stripe-shaped source-drain doping region 52, as shown in FIG. 16. Because of the differences in temperature that arise during the operations of step 82, the concentrations of energy-barrier-forming implants 44 become asymmetric on opposing sides of each gate structure (i.e., regions 44S and 44W are formed), thereby producing asymmetric transistors 32 of FIG. 14. Dopant 44 may be formed with a concentration that is sufficient to equalize pass gate rise time tr and fall time tf, as described in connection with FIG. 10.

Postprocessing may be performed during the operations of step 84. For example, interconnect structures and other structures may be formed on the top of the integrated circuit, the integrated circuit may be bonded to pins in a package, etc.

The use of asymmetric transistors such as asymmetric pass gates may help reduce leakage currents for a given pass gate speed, may help to improve transistor speed, or may be used in reducing leakage current while improving transistor performance. N-channel and p-channel asymmetric transistors may be formed if desired. Transistors may be used in multiplexers controlled by static control signals from memory elements 20 (e.g., multiplexers that form part of the programmable routing structures on a programmable integrated circuit) or may be used in other suitable circuitry on integrated circuit 10.

In accordance with an embodiment, a method for forming an integrated circuit with asymmetric transistors is provided that includes asymmetrically heating pocket implants in a transistor structure to form asymmetric transistors having asymmetric pocket implants.

In accordance with another embodiment, equipment for forming an integrated circuit with asymmetric transistors is provided that includes means for forming gate structures with unequal spacings, means for forming symmetric energy-barrier-forming doped regions on opposing sides of each of the gate structures, and means for asymmetrically heating the symmetric energy-barrier-forming doped regions to form asymmetric transistors.

In accordance with another embodiment, an integrated circuit with asymmetric pass transistors is provided, wherein each asymmetric pass transistor comprises means for passing logic signals with equal rise and fall times.

In accordance with another embodiment, an integrated circuit is provided that has means for storing control signals and means for providing the stored control signals to asymmetric pass transistors.

The foregoing is merely illustrative of the principles of this invention and various modifications can be made by those skilled in the art without departing from the scope and spirit of the invention.

What is claimed is:

1. Circuitry, comprising:
a plurality of asymmetric transistors on an integrated circuit, wherein the asymmetric transistors each have a first source-drain terminal, a second source-drain terminal, and a gate, wherein there is more of an energy barrier at the first source-drain terminal than at the second source-drain terminal which creates asymmetry in the asymmetric transistors, and wherein the gates of the asymmetric transistors include gate structures that are unequally spaced along a source-drain doping region from which the first and second source-drain terminals are formed.

2. The circuitry defined in claim 1 wherein the gate structures include adjacent pairs of gate structures some of which are spaced apart by a first distance and some of which are spaced apart by a second distance that is smaller than the first distance.

3. The circuitry defined in claim 1 wherein the source-drain doping region comprises a rectangular stripe-shaped source-drain doping region from which the first and second source-drain terminals are formed.

4. The circuitry defined in claim 3 wherein each gate structure comprises a gate conductor that spans the rectangular strip-shaped source-drain doping region at a different respective location, wherein the gate structures include pairs of adjacent gate structures, and wherein the gate conductors in some of the pairs of the adjacent gate structures are spaced apart by more than the gate conductors in other pairs of the adjacent gate structures.

5. The circuitry defined in claim 4 wherein the asymmetric transistors comprise pass transistors and wherein the circuitry include conductive lines that provide control signals to the gates of the asymmetric transistors.

6. The circuitry defined in claim 5 further comprising memory elements that produce static output signals, wherein the conductive lines convey the static output signals to the gates.

7. The circuitry defined in claim 1 wherein each gate comprises a first and second adjacent gate structures and wherein the first source-drain terminal of each of the asymmetric transistors is located between the first and second adjacent gate structures.

8. The circuitry defined in claim 1 further comprising at least one pair of memory elements, wherein at least some of the asymmetric transistors are located between the pair of memory elements.

9. The circuitry defined in claim 1 wherein each of the asymmetric transistors comprises an n-channel metal oxide-semiconductor transistor.

10. The circuitry defined in claim 9 wherein each of the asymmetric transistors has a first p-type energy-barrier-producing implant having a first dopant concentration at its first source-drain region and has a second p-type energy-barrier producing implant having a second dopant concentration that is less than the first dopant concentration at its second source-drain region.

11. A circuit, comprising:
a first buffer that receives signals and that provides a strengthened version of the signals at an output;
an asymmetric n-channel pass transistor having an energy barrier at a first source-drain terminal and having a second source-drain terminal, wherein the first source-drain terminal is coupled to the output of the first buffer; and
a second buffer that receives signals from the second source-drain terminal.

12. The circuit defined in claim 11 further comprising a memory element that provides a static output signal, wherein the asymmetric n-channel pass transistor has a gate that receives the static output signal.

13. The circuit defined in claim 12 further comprising an additional asymmetric n-channel pass transistor having an energy barrier at a first source-drain terminal and having a second source-train terminal, wherein the first source-drain terminal of the additional asymmetric n-channel pass transistor is coupled to the second source-drain terminal of the asymmetric n-channel pass transistor and wherein the second source-drain terminal of the additional asymmetric n-channel pass transistor is connected to an input of the second buffer.

14. The circuit defined in claim 11 further comprising a multiplexer, wherein the asymmetric n-channel pass transistor comprises part of the multiplexer.

15. The circuit defined in claim 11 wherein the first and second buffers and the asymmetric n-channel pass transistor form a programmable interconnect.

16. The circuit defined in claim 12 wherein the memory element comprises at least one symmetric transistor.

* * * * *